(12) United States Patent
Tai et al.

(10) Patent No.: US 6,658,716 B2
(45) Date of Patent: Dec. 9, 2003

(54) METHOD FOR ASSEMBLING MOTOR ASSEMBLY TO SUPPORT WAFER

(75) Inventors: Zhi-Zhao Tai, Hsinchu (TW);
Wen-Kan Hu, Hsinchu (TW);
Ching-Shun Fan, Hsinchu (TW);
Li-Chun Liang, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 3 days.

(21) Appl. No.: 10/106,676

(22) Filed: Mar. 25, 2002

(65) Prior Publication Data

US 2002/0148098 A1 Oct. 17, 2002

(30) Foreign Application Priority Data

Apr. 16, 2001 (TW) ........................................ 90109016 A

(51) Int. Cl.$^7$ ................................................ B23Q 3/00
(52) U.S. Cl. .................... 29/464; 29/525.01; 29/525.11; 411/379
(58) Field of Search .............................. 29/464, 525.01, 29/525.11, 271, 407.09, 407.1, 559; 411/379, 389, 395

(56) References Cited

U.S. PATENT DOCUMENTS 1,207,391 A * 12/1916 Frauenheim ................ 411/379
4,493,815 A * 1/1985 Fernwood et al. .......... 422/101
5,219,528 A * 6/1993 Clark ......................... 422/101

FOREIGN PATENT DOCUMENTS

JP 10133541 A * 5/1998

* cited by examiner

Primary Examiner—Gregory Vidovich
Assistant Examiner—Jermie E. Cozart
(74) Attorney, Agent, or Firm—Townsend and Townsend and Crew LLP

(57) ABSTRACT

The present invention provides an auxiliary tool for assembling a motor assembly to a wafer-deposition machine for supporting a wafer. The auxiliary tool facilitates easy and quick assembly of the motor assembly to the wafer-deposition machine. An aspect of the present invention is directed to an auxiliary tool for assembling a motor assembly to a wafer-deposition machine, wherein the motor assembly includes a plurality of first screw holes and the wafer-deposition machine includes a plurality of second screw holes corresponding to the first screw holes, respectively. The auxiliary tool comprises a plurality of locking members each having a substantially uniform dimension in a longitudinal direction and being configured to be inserted through one of the plurality of first screw holes of the motor assembly with a corresponding one of the plurality of second screw holes of the wafer-deposition machine to align the first screw hole with the corresponding second screw hole. The auxiliary tool further comprises a plurality of supporting members. At least one supporting member is releasably coupled to each of the plurality of locking members to support the motor assembly with respect to the wafer-deposition machine to keep the locking member inserted through the first screw hole and the corresponding second screw hole and to maintain alignment of the first screw hole and the corresponding second screw hole.

13 Claims, 3 Drawing Sheets

METHOD FOR ASSEMBLING MOTOR ASSEMBLY TO SUPPORT WAFER

CROSS-REFERENCES TO RELATED APPLICATIONS

This application claims priority from R.O.C. Patent Application No. 090109016, filed Apr. 16, 2001, the entire disclosure of which is incorporated herein by reference.

BACKGROUND OF THE INVENTION

The invention relates to an auxiliary tool for assembling a motor assembly to support a wafer to be deposited and its assembly method; in particular, the invention relates to an auxiliary tool that can readily assemble the motor assembly.

FIG. 1a shows a typical machine for deposition. Four supports 3 are disposed on a base 2, and support a wafer 1 to be deposited. Each support 3 connects to a bearing 41 along with which can move along in a downward-upward direction.

Referring to FIG. 1b, the base 2 is provided with a plurality of second screw holes 21. In FIG. 1b, the quantity of the second screw holes 21 is four. The bearing 41 is disposed inside a motor assembly 4. The motor assembly 4 is provided with a plurality of first screw holes 45 corresponding to the second screw holes 21, respectively. Four original bolts 42 are provided to screw into the second screw holes 21 after passing through the first screw holes 45. The motor assembly 4 is mounted to the base 2 by the original bolts 42 penetrating the first screw holes 45 and the second screw holes 21 in order. It is noted that there are four motor assemblies 4 located beneath the base 2. However, there is only one motor assembly 4 shown in FIG. 1b.

Referring to FIG. 1c, the original bolt 42 is provided with a large diameter portion 421, a small diameter portion 422 and a threaded portion 423. The large diameter portion 421 supports the motor assembly 4. The small diameter portion 422 passes through the first screw hole 45 and the second screw hole 21. The threaded portion 423 screws into the first screw hole 45 and the second screw hole 21.

Since the motor assembly 4 is mounted beneath the base 2, and the distance between the motor assembly 4 and the base 2 is too short to assemble easily, the assembly is troublesome. In addition, there are other devices and pipes attached to the base 2, and thus the assembly space is limited. Furthermore, the whole motor assembly 4, including a motor 43, a gear 44, the bearing 41 and others, has a certain weight; the assembly of the motor assembly 4 is therefore more difficult.

Specifically, to mount the motor assembly 4 to the base 2, the whole motor assembly 4 must be manually held while the bolt 42 is also manually held. Thus, it is very difficult to align the original bolt 42 with the screw hole 45, 21. As a result, assembly speed is difficult to improve.

BRIEF SUMMARY OF THE INVENTION

In view of the disadvantages of the aforementioned conventional assembly method, the invention provides an auxiliary tool for assembling a motor assembly to a wafer-deposition machine for supporting a wafer. The auxiliary tool of this invention facilitates easy and quick assembly of the motor assembly to the wafer-deposition machine.

An aspect of the present invention is directed to an auxiliary tool for assembling a motor assembly to a wafer-deposition machine, wherein the motor assembly includes a plurality of first screw holes and the wafer-deposition machine includes a plurality of second screw holes corresponding to the first screw holes, respectively. The auxiliary tool comprises a plurality of locking members each having a substantially uniform dimension in a longitudinal direction and being configured to be inserted through one of the plurality of first screw holes of the motor assembly with a corresponding one of the plurality of second screw holes of the wafer-deposition machine to align the first screw hole with the corresponding second screw hole. The auxiliary tool further comprises a plurality of supporting members. At least one supporting member is releasably coupled to each of the plurality of locking members to support the motor assembly with respect to the wafer-deposition machine to keep the locking member inserted through the first screw hole and the corresponding second screw hole and to maintain alignment of the first screw hole and the corresponding second screw hole.

In some embodiments, each locking member comprises a cylindrical bolt having a uniform diameter. Each locking member comprises at least one through aperture through which a supporting member releasably passes, wherein the through aperture is nonparallel to the longitudinal direction of the locking member. The through aperture may be substantially perpendicular to the longitudinal direction of the locking member. Each supporting member may comprise a pin.

In specific embodiments, each locking member comprises a pair of through apertures for receiving a pair of supporting members. The pair of through apertures include a first through aperture configured to be disposed on a first side of the motor assembly and the wafer-deposition machine and a second through aperture configured to be disposed on a second side of the motor assembly and the wafer-deposition machine opposite from the first side, after the locking member is inserted through the first screw hole of the motor assembly and the corresponding second screw hole of the wafer-deposition machine. Each locking member may have a threaded portion at at least one of two ends.

In accordance with another aspect of the present invention, a method for assembling a motor assembly to a wafer-deposition machine comprises disposing the motor assembly adjacent to the deposition machine. At a first location, a locking member is inserted through one of the plurality of first screw holes of the motor assembly and a corresponding one of the plurality of second screw holes of the wafer-deposition machine to align the first screw hole with the corresponding second screw hole at the first location. At least one supporting member is releasably coupled to the locking member to support the motor assembly with respect to the wafer-deposition machine to keep the locking member inserted through the first screw hole and the corresponding second screw hole and to maintain alignment of the first screw hole and the corresponding second screw hole at the first location. At each of one or more remaining locations, an attachment bolt is inserted through another one of the plurality of first screw holes of the motor assembly and a corresponding one of the plurality of second screw holes of the wafer-deposition machine to align the first screw hole with the corresponding second screw hole and to fasten the motor assembly to the wafer-deposition machine at each of the one or more remaining locations. The at least one supporting member and the locking member are removed at the first location. At the first location, another attachment bolt is inserted through the first screw hole of the motor assembly and the corresponding second screw holes of the wafer-deposition machine to align the first screw hole with the corresponding second screw hole and to fasten the motor assembly to the wafer-deposition machine at the first location.

In some embodiments, another locking member is inserted through one of the plurality of first screw holes of the motor assembly and a corresponding one of the plurality of second screw holes of the wafer-deposition machine to align the first screw hole with the corresponding second screw hole at a second location, prior to inserting the attachment bolt at each of one or more remaining locations. At least one supporting member is releasably coupled to the locking member at the second location to support the motor assembly with respect to the wafer-deposition machine to keep the locking member inserted through the first screw hole and the corresponding second screw hole and to maintain alignment of the first screw hole and the corresponding second screw hole at the second location. After inserting the attachment bolt at each of the remaining locations, the at least one supporting member and the locking member are removed at the second location. At the second location, another attachment bolt is inserted through the first screw hole of the motor assembly and the corresponding second screw holes of the wafer-deposition machine to align the first screw hole with the corresponding second screw hole and to fasten the motor assembly to the wafer-deposition machine at the second location.

In some embodiments, the plurality of first screw holes and the plurality of second screw holes are distributed around a center of the wafer-deposition machine. The first location and the second location are disposed generally on opposite sides of the center of the wafer-deposition machine.

DETAILED DESCRIPTION OF THE INVENTION

Figure 1A:
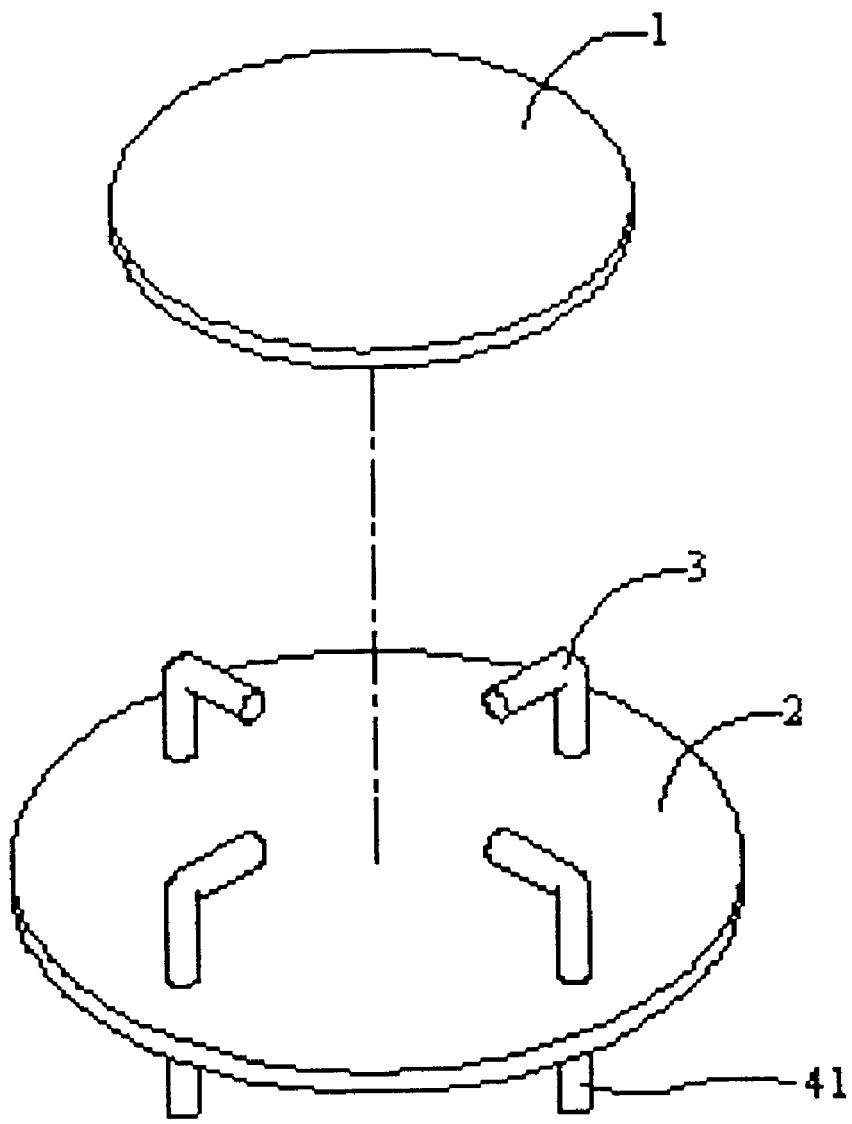
FIG. 1a is a schematic view depicting a typical machine for deposition.
Figure 1B:
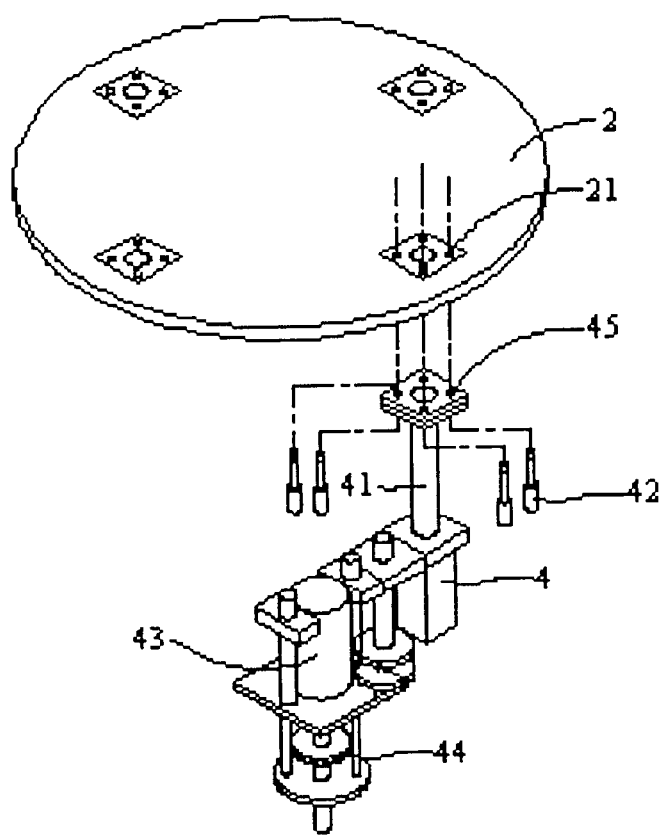
FIG. 1b is a perspective view depicting the relationship between the deposition machine and a motor assembly.
Figure 1C:
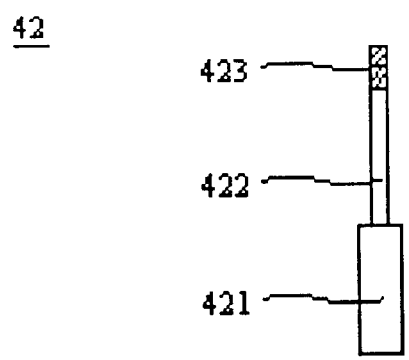
FIG. 1c is a front view depicting an original bolt.
Figure 2A:
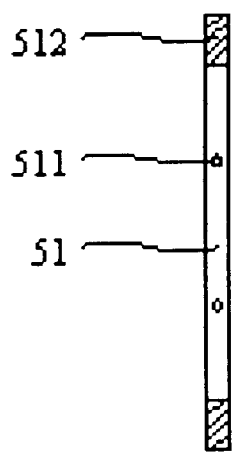
FIG. 2a is a side view depicting a locking member according to an embodiment of this invention.
Figure 2B:
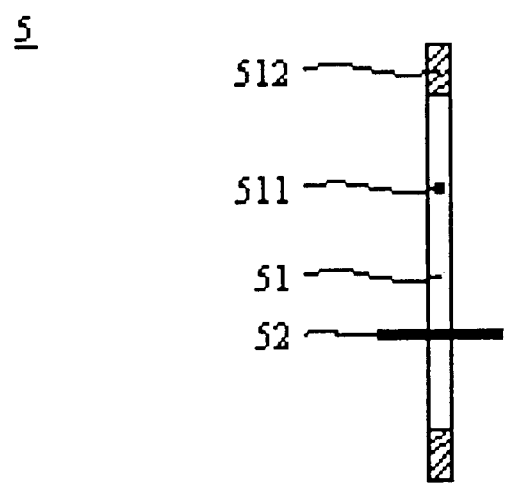
FIG. 2b is a side view depicting an auxiliary tool according to an embodiment of this invention.

Referring to FIG. 2a and FIG. 2b, an auxiliary tool 5 of the present invention is used to mount a motor assembly 4 as shown in FIG. 1b to a base 2 as shown in FIG. 1b. As shown in FIG. 1b, the motor assembly 4 is provided with a plurality of first screw holes 45, and the base 2 is provided with a plurality of second screw holes 21 corresponding to the first screw holes 45.

The auxiliary tool 5 comprises a plurality of locking members 51 and a plurality of supporting members 52.

As shown in FIG. 2a, the locking member 51 is a cylinder-shaped bolt. The locking member 51, with a uniform diameter, is used to align the first screw hole 45 and the second screw hole 21. The locking member 51 is provided with at least one and more desirably two through apertures 511 each for the supporting member 52 to pass therethrough. The supporting member 52 is typically a pin. The through apertures 511 are nonparallel to the longitudinal direction of the locking member 51, and typically are substantially perpendicular to the longitudinal direction of the locking member 51. The locking member 51 is provided with a threaded portion 512 at each end; therefore, each end of the locking member 51 can be screw into the screw hole.

In addition, when the locking member 51, after screwing into the first screw hole 45, resists detachment from the base 2, the through aperture 511 can be used as a point of action. Thus, a fixture, such as a clamping device, can be avoided, and the damage to the locking member 51 can be prevented.

The supporting member 52 is disposed on the locking member 51 by passing through the through aperture 511, and supports the motor assembly 4, the first screw hole 45 of which has been aligned with the second screw hole 21.

The auxiliary tool 5 of the present invention is described as above, and the method of mounting the motor assembly 4 to the base 2 by using the auxiliary tool 5 is described as follows.

First, the motor assembly 4 is disposed adjacent the base 2, and two locking members 51 then pass through and screw into two first screw holes 45 and the second screw holes 21 corresponding to the first screw holes 45. It is noted that two first screw holes 45, being screwed first, are desirably located at opposite sides or at diagonal corners of the base 2.

Second, two supporting members 52 are disposed on the locking members 51 while two original attachment bolts 42, as shown in FIG. 1b, pass through and screw into another two first screw holes 45 and the second screw holes 21 corresponding to the first screw holes 45.

Finally, the locking members 51, screwed into the screw hole 45 and 21, are disassembled from the base 2 and the motor assembly 4. Two original attachment bolts 42 then pass through and screw into two first screw holes 45 and the second screw holes 21 corresponding to the first screw holes 45 that are screwed with the locking members 51 previously. As a result, the motor assembly 4 is mounted to the base 2.

Since the diameter of the locking member 51 is uniform, it is convenient to pass the locking member 51 through the screw holes 45, 21. Thus, assembly time is improved because the large diameter portion 421 of the attachment bolt 42 is removed.

Furthermore, although this embodiment shows the use of four screw holes 21 and four supports, they are not so limited in other embodiments.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A method for assembling a motor assembly to a wafer-deposition machine, the motor assembly including a plurality of first screw holes and the wafer-deposition machine including a plurality of second screw holes corresponding to the first screw holes, respectively, the method comprising:

disposing the motor assembly adjacent to the deposition machine;

inserting, at a first location, a locking member through one of the plurality of first screw holes of the motor assembly and a corresponding one of the plurality of second screw holes of the wafer-deposition machine to align the first screw hole with the corresponding second screw hole at the first location;

releasably coupling at least one supporting member to the locking member to support the motor assembly with respect to the wafer-deposition machine to keep the locking member inserted through the first screw hole and the corresponding second screw hole and to maintain alignment of the first screw hole and the corresponding second screw hole at the first location;

inserting, at each of one or more remaining locations, an attachment bolt through another one of the plurality of first screw holes of the motor assembly and a corresponding one of the plurality of second screw holes of the wafer-deposition machine to align the first screw hole with the corresponding second screw hole and to fasten the motor assembly to the wafer-deposition machine at each of the one or more remaining locations;

removing the at least one supporting member and the locking member at the first location; and inserting, at the first location, another attachment bolt through the first screw hole of the motor assembly and the corresponding second screw holes of the wafer-deposition machine to align the first screw hole with the corresponding second screw hole and to fasten the motor assembly to the wafer-deposition machine at the first location.

2. The method of claim 1 wherein each locking member comprises a cylinder-shaped bolt having a uniform diameter.

3. The method of claim 1 wherein releasably coupling at least one supporting member to the locking member comprises passing the supporting member through a through aperture of the locking member, the through aperture being nonparallel to the longitudinal direction of the locking member.

4. The method of claim 3 wherein the through aperture is substantially perpendicular to the longitudinal direction of the locking member.

5. The method of claim 3 wherein each supporting member comprises a pin.

6. The method of claim 3 wherein a pair of supporting members are releasably passed through a pair of through apertures of the locking member, the pair of through apertures including a first through aperture configured to be disposed on a first side of the motor assembly and the wafer-deposition machine and a second through aperture configured to be disposed on a second side of the motor assembly and the wafer-deposition machine opposite from the first side, after the locking member is inserted through the first screw hole of the motor assembly and the corresponding second screw hole of the wafer-deposition machine.

7. The method of claim 1 wherein the locking member has a threaded portion at at least one of two ends to be threadingly inserted through the first screw hole and the corresponding second screw hole.

8. The method of claim 1 further comprising, prior to inserting the attachment bolt at each of one or more remaining locations:

inserting, at a second location, another locking member through one of the plurality of first screw holes of the motor assembly and a corresponding one of the plurality of second screw holes of the wafer-deposition machine to align the first screw hole with the corresponding second screw hole at the second location;

releasably coupling at least one supporting member to the locking member at the second location to support the motor assembly with respect to the wafer-deposition machine to keep the locking member inserted through the first screw hole and the corresponding second screw hole and to maintain alignment of the first screw hole and the corresponding second screw hole at the second location.

9. The method of claim 8 further comprising:

removing the at least one supporting member and the locking member at the second location; and inserting, at the second location, another attachment bolt through the first screw hole of the motor assembly and the corresponding second screw holes of the wafer-deposition machine to align the first screw hole with the corresponding second screw hole and to fasten the motor assembly to the wafer-deposition machine at the second location.

10. A method for assembling a motor assembly to a wafer-deposition machine, the motor assembly including a plurality of first screw holes and the wafer-deposition machine including a plurality of second screw holes corresponding to the first screw holes, respectively, the method comprising:

disposing the motor assembly adjacent to the deposition machine;

inserting, at a first location, a locking member through one of the plurality of first screw holes of the motor assembly and a corresponding one of the plurality of second screw holes of the wafer-deposition machine to align the first screw hole with the corresponding second screw hole at the first location;

releasably coupling at least one supporting member to the locking member at the first location to support the motor assembly with respect to the wafer-deposition machine to keep the locking member inserted through the first screw hole and the corresponding second screw hole and to maintain alignment of the first screw hole and the corresponding second screw hole at the first location;

inserting, at a second location, another locking member through one of the plurality of first screw holes of the motor assembly and a corresponding one of the plurality of second screw holes of the wafer-deposition machine to align the first screw hole with the corresponding second screw hole at the second location;

releasably coupling at least one supporting member to the locking member at the second location to support the motor assembly with respect to the wafer-deposition machine to keep the locking member inserted through the first screw hole and the corresponding second screw hole and to maintain alignment of the first screw hole and the corresponding second screw hole at the second location;

inserting, at each of one or more remaining locations, an attachment bolt through another one of the plurality of first screw holes of the motor assembly and a corresponding one of the plurality of second screw holes of the wafer-deposition machine to align the first screw hole with the corresponding second screw hole and to fasten the motor assembly to the wafer-deposition machine at each of the one or more remaining locations;

removing the at least one supporting member and the locking member at the first location;

inserting, at the first location, another attachment bolt through the first screw hole of the motor assembly and the corresponding second screw holes of the wafer-deposition machine to align the first screw hole with the corresponding second screw hole and to fasten the motor assembly to the wafer-deposition machine at the first location;

removing the at least one supporting member and the locking member at the second location; and inserting, at the second location, another attachment bolt through the first screw hole of the motor assembly and the corresponding second screw hole of the wafer-deposition machine to align the first screw hole with the corresponding second screw hole and to fasten the motor assembly to the wafer-deposition machine at the second location.

11. The method of claim 10 wherein releasably coupling at least one supporting member to the locking member comprises passing the supporting member through a through aperture of the locking member, the through aperture being substantially perpendicular to the longitudinal direction of the locking member.

12. The method of claim 11 wherein a pair of supporting members are releasably passed through a pair of through apertures of each locking member, the pair of through apertures including a first through aperture configured to be disposed on a first side of the motor assembly and the wafer-deposition machine and a second through aperture configured to be disposed on a second side of the motor assembly and the wafer-deposition machine opposite from the first side, after the locking member is inserted through the first screw hole of the motor assembly and the corresponding second screw hole of the wafer-deposition machine.

13. The method of claim 10 wherein the plurality of first screw holes and the plurality of second screw holes are distributed around a center of the wafer-deposition machine, and wherein the first location and the second location are disposed generally on opposite sides of the center of the wafer-deposition machine.

* * * * *